United States Patent
Larsen et al.

(10) Patent No.: US 9,345,172 B2
(45) Date of Patent: *May 17, 2016

(54) EQUIPMENT RACK AND ASSOCIATED VENTILATION SYSTEM

(71) Applicants: Ortronics, Inc., New London, CT (US); Charlene A. Levesque, Scotland, CT (US)

(72) Inventors: Lars R. Larsen, Old Lyme, CT (US); Stewart A. Levesque, Scotland, CT (US)

(73) Assignee: Ortronics, Inc., New London, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/582,682

(22) Filed: Dec. 24, 2014

(65) Prior Publication Data

US 2015/0118950 A1      Apr. 30, 2015

Related U.S. Application Data

(63) Continuation of application No. 14/221,835, filed on Mar. 21, 2014, which is a continuation of application No. 29/427,964, filed on Jul. 24, 2012, which is a continuation of application No. 13/180,778, filed on (Continued)

(51) Int. Cl.
*H05K 7/20* (2006.01)
*H04Q 1/06* (2006.01)

(Continued)

(52) U.S. Cl.
CPC ............ *H05K 7/20572* (2013.01); *F24F 13/00* (2013.01); *H04Q 1/035* (2013.01);

(Continued)

(58) Field of Classification Search
CPC .............. H04Q 1/062; H04Q 2201/02; H04Q 2201/06; F24F 13/08; H05K 7/20545; H05K 7/20554; H05K 7/20572
See application file for complete search history.

(56) References Cited

U.S. PATENT DOCUMENTS 2,618,076 A    11/1952  Miller
3,010,706 A    11/1961  Mcwilliams
(Continued)

FOREIGN PATENT DOCUMENTS

EP    1871156      12/2007
GB    2 437 770     7/2007
(Continued)

OTHER PUBLICATIONS

Engineering Drawing for Project: D-4 Bay 23 Baffles; Title: Bay 23, Drawing No. H-1, Atkinson Koven Feinberg Engineers, dated Jan. 28, 2000 (submitted in color to facilitate review of green verbiage).

(Continued)

*Primary Examiner* — Robert J Hoffberg
(74) *Attorney, Agent, or Firm* — McCarter & English, LLP

(57) ABSTRACT

A cable management rack is provided within which a heat-generating device is mountable. The rack includes a first upright and a second upright attached to opposite respective lateral sides of a base and a top member, and respective side-facing panels. Each of the panels defines a plurality of vent holes arranged in an array. A cable management system includes a cable management rack for accommodating a heat generating device, a first baffle mounted with respect to a first upright of the rack and for redirecting a rearward flow of cool air sideways from a space adjacent a front side of the rack, and a second baffle mounted with respect to a second upright of the rack and for redirecting a sideways flow of exhaust air from the rack and through the second upright into a space adjacent a rear side of the rack.

25 Claims, 7 Drawing Sheets

Related U.S. Application Data

Jul. 12, 2011, now Pat. No. 8,526,181, which is a continuation of application No. 12/468,407, filed on May 19, 2009, now Pat. No. 7,983,038, which is a continuation-in-part of application No. 11/942,298, filed on Nov. 19, 2007, now abandoned.

(51) Int. Cl.
*F24F 13/00* (2006.01)
*H04Q 1/02* (2006.01)

(52) U.S. Cl.
CPC ............... *H04Q 1/062* (2013.01); *H04Q 1/09* (2013.01); *H05K 7/20* (2013.01); *H05K 7/20709* (2013.01); *H04Q 2201/02* (2013.01); *H04Q 2201/06* (2013.01)

(56) References Cited

U.S. PATENT DOCUMENTS

| | | |
|---|---|---|
| 3,620,588 A | 11/1971 | Fedinand et al. |
| 3,874,444 A | 4/1975 | Perce et al. |
| 4,407,187 A | 10/1983 | Horney |
| 4,726,285 A | 2/1988 | Kelley |
| 4,758,925 A * | 7/1988 | Obata et al. ................... 361/695 |
| 4,785,925 A | 11/1988 | Frisbie et al. |
| 5,063,477 A | 11/1991 | Paggen et al. |
| 5,201,879 A | 4/1993 | Steele |
| 5,307,942 A | 5/1994 | Quelfeter et al. |
| 5,528,454 A | 6/1996 | Niklos |
| 5,540,339 A | 7/1996 | Lerman |
| D385,958 S | 11/1997 | Higashino et al. |
| 5,721,670 A | 2/1998 | Cochrane et al. |
| 5,796,580 A | 8/1998 | Komatsu et al. |
| 5,910,639 A | 6/1999 | Kunkel |
| 5,914,858 A | 6/1999 | McKeen et al. |
| 5,934,485 A | 8/1999 | Harris et al. |
| 5,969,942 A | 10/1999 | Heckner et al. |
| 5,991,163 A | 11/1999 | Marconi et al. |
| 6,058,712 A | 5/2000 | Rajasubramanian et al. |
| 6,119,768 A | 9/2000 | Dreier et al. |
| 6,181,557 B1 | 1/2001 | Gatti |
| 6,261,111 B1 | 7/2001 | Castleman |
| 6,347,714 B1 * | 2/2002 | Fournier et al. ................. 211/26 |
| 6,454,646 B1 | 9/2002 | Helgenberg et al. |
| 6,480,381 B2 * | 11/2002 | Negishi ........................ 361/695 |
| 6,506,065 B1 | 1/2003 | Castleman |
| 6,625,020 B1 * | 9/2003 | Hanson et al. ................ 361/695 |
| 6,702,125 B2 | 3/2004 | Hartel |
| 6,717,807 B2 | 4/2004 | Hikawa |
| 6,719,150 B2 | 4/2004 | Marraffa |
| 6,888,069 B1 | 5/2005 | Chen et al. |
| 6,914,779 B2 | 7/2005 | Askeland et al. |
| 6,924,979 B2 | 8/2005 | Clements et al. |
| 6,932,443 B1 | 8/2005 | Kaplan et al. |
| 6,946,605 B2 | 9/2005 | Levesque et al. |
| 6,974,036 B2 | 12/2005 | Wyatt et al. |
| 7,026,553 B2 | 4/2006 | Levesque et al. |
| 7,085,133 B2 * | 8/2006 | Hall ............................. 361/695 |
| 7,215,543 B2 | 5/2007 | Arbogast et al. |
| 7,256,992 B1 | 8/2007 | Stewart et al. |
| 7,286,345 B2 * | 10/2007 | Casebolt ............ H05K 7/20736 361/679.48 |
| 7,385,810 B2 | 6/2008 | Chu et al. |
| D578,633 S | 10/2008 | Schluter et al. |
| 7,438,638 B2 | 10/2008 | Lewis et al. |
| 7,498,512 B2 | 3/2009 | Adducci et al. |
| 7,499,273 B2 | 3/2009 | Casebolt |
| 7,522,414 B2 | 4/2009 | Karstens |
| 7,595,985 B2 | 9/2009 | Adducci et al. |
| 7,611,799 B2 | 11/2009 | Marraffa |
| 7,724,513 B2 * | 5/2010 | Coglitore ............ H05K 7/20745 165/104.33 |
| 7,855,885 B2 | 12/2010 | Adducci et al. |
| 7,874,433 B2 | 1/2011 | Levesque et al. |
| 7,878,888 B2 | 2/2011 | Rasmussen et al. |
| 7,909,902 B2 | 3/2011 | Eckberg et al. |
| 7,983,038 B2 * | 7/2011 | Levesque et al. ............. 361/692 |
| 8,009,430 B2 | 8/2011 | Claassen et al. |
| 8,035,965 B2 | 10/2011 | Adducci et al. |
| 8,054,619 B1 * | 11/2011 | Antosh ..................... 361/679.31 |
| 8,130,494 B2 * | 3/2012 | Larsen et al. .................. 361/690 |
| 8,154,867 B2 | 4/2012 | Shearman et al. |
| 8,400,765 B2 | 3/2013 | Ross |
| 8,526,181 B2 * | 9/2013 | Levesque et al. ............. 361/690 |
| 8,605,435 B1 * | 12/2013 | Ashby ........................... 361/695 |
| 8,804,333 B2 * | 8/2014 | Ashby ........................... 361/695 |
| 8,861,200 B2 * | 10/2014 | Malmberg ..................... 361/695 |
| D730,299 S * | 5/2015 | Levesque et al. ............. D13/155 |
| 9,060,448 B2 * | 6/2015 | Lenart |
| 2002/0046979 A1 * | 4/2002 | Larsen et al. ................... 211/26 |
| 2005/0135075 A1 | 6/2005 | Deng |
| 2005/0276017 A1 | 12/2005 | Aziz et al. |
| 2006/0043031 A1 | 3/2006 | Rinderer |
| 2008/0013276 A1 | 1/2008 | Pyle |
| 2009/0109619 A1 * | 4/2009 | Wise et al. ..................... 361/695 |
| 2009/0129014 A1 * | 5/2009 | Larsen et al. .................. 361/692 |
| 2014/0016266 A1 * | 1/2014 | Lenart ........................... 361/690 |
| 2014/0206273 A1 * | 7/2014 | Larsen et al. .................. 454/184 |
| 2014/0370798 A1 * | 12/2014 | Larsen et al. .................. 454/184 |
| 2015/0076097 A1 * | 3/2015 | Powers .................... H04Q 1/02 211/183 |

FOREIGN PATENT DOCUMENTS

| | | |
|---|---|---|
| WO | WO 2004/103046 | 11/2004 |
| WO | WO 2010/135233 | 5/2010 |

OTHER PUBLICATIONS

PCT International Search Report for International Application No. PCT/US2008/083959 dated Jan. 29, 2009.
PCT Written Opinion for International Application No. PCT/US2008/083959 dated Jan. 29, 2009.
PCT International Search Report and Written Opinion dated Jul. 14, 2010 for International Application No. PCT/US2010/035100.
Might Mo® 6, Product Specification, Ortronics.
Cisco Catalyst 6513 Switch, Product Specification, Cisco.
Extended European Search Report from EP 1871156 dated Mar. 22, 2011, (at end of 1871156).
Extended European Search Report from EP 8851639 dated Feb. 25, 2011.

\* cited by examiner

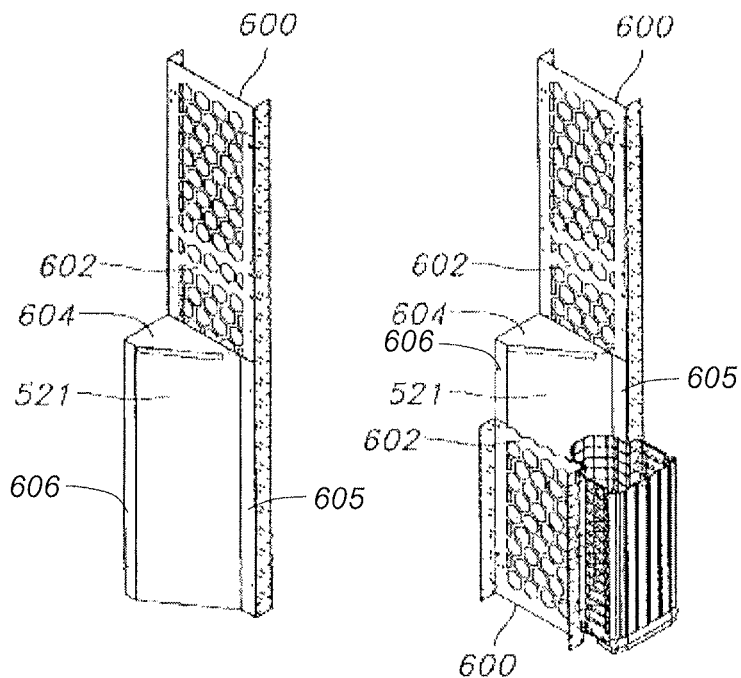
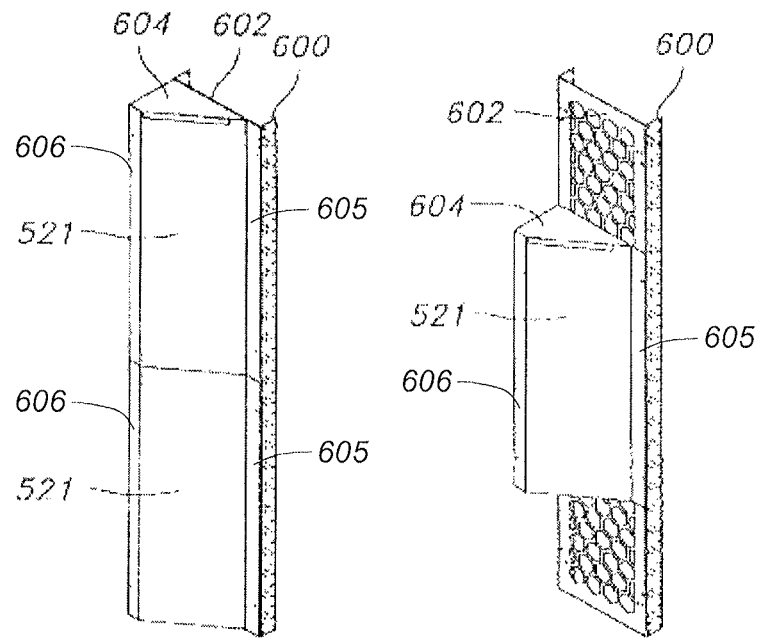

Fan assembly

EQUIPMENT RACK AND ASSOCIATED VENTILATION SYSTEM

CROSS REFERENCE TO RELATED APPLICATIONS

This application is a continuation of co-pending U.S. patent application Ser. No. 14/221,835, filed Mar. 21, 2014, which is a continuation of co-pending U.S. Design patent application Ser. No. 29/427,964, filed on Jul. 24, 2012, which is a continuation of U.S. patent application Ser. No. 13/180,778, filed Jul. 12, 2011, now U.S. Pat. No. 8,526,181, which is a continuation of U.S. patent application Ser. No. 12/468,407, filed on May 19, 2009, now U.S. Pat. No. 7,983,038, which is a continuation-in-part of U.S. patent application Ser. No. 11/942,298, filed on Nov. 19, 2007, now abandoned. This application claims priority benefit to each of the foregoing applications and hereby incorporates by reference each of the foregoing applications in their entireties as part of the present disclosure.

BACKGROUND

1. Technical Field

The present disclosure is directed generally to rack systems for use in positioning of electronic components and/or equipment and, more particularly, to cable management racks and equipment ventilation systems associated therewith.

2. Background Art

Cable management systems (such as cable racks, bays or frames, which are hereinafter referred to as "racks") have long been used in many varied applications, such as in communications and electronic services, and are generally located in indoor rooms, closures, offices or controlled environmental vaults. A known common construction that has evolved for such racks is one shown in FIG. 1 in the form of a rack 100. The rack 100 encompasses a tall, rectangular frame, typically constructed with two uprights 102 attached to a base 104 and a top member 106, the latter commonly incorporating a waterfall 108 useful for ensuring that appropriately large bend radii are formed in cables extending to, from, and along the top member 108, as discussed in greater detail below. Referring now to FIG. 2, an arrangement 200 includes two instances of a cable management rack that may be substantially similar to the rack 100 of FIG. 1, including a rack 202 and a rack 204, the racks 202 and 204 being positioned adjacent to each other in a side-by-side configuration and including respective waterfalls 206, 208. Also included in the arrangement 200 are three instances of a conventional cable management cage, a first of which, a cage 210, is somewhat larger than the others and is positioned between the rack 202 and the rack 204, a second of which, a cage 212, is somewhat smaller and is positioned on an opposite side of the rack 202 from the cage 210, and a third of which, a cage 214, is approximately the same size as the cage 212 and is positioned on an opposite side of the rack 204 from the cage 210. The arrangement 200 further includes a variety of devices, e.g., a device 216 and a device 218 mounted within the rack 202 (e.g., wherein the device 216 is a patch panel, and a device 220 and a device 222 mounted within the rack 204, and a variety of cables 224 extending vertically within the cages 210, 212, 214, forming a variety of bend radii (e.g., a bend radius 226 associated with the waterfall 206), extending horizontally inward across the respective fronts of the racks 202, 204, and interconnecting with the various devices (e.g., the devices 216, 218, 220, 222) mounted within the racks 202, 204. The arrangement 200 still further includes a corresponding variety of cables 226 interconnecting with the various devices mounted within the racks 202, 204, extending horizontally outward across the respective rears of the racks 202, 204, and extending vertically within the cages 210, 212, 214.

The devices mounted within the racks 202, 204 may be cross connect panels, patch panels, or any one of a variety of other types of devices requiring the orderly accomplishment of cable interconnections. In many instances, a rack mounted device, such as the device 218, requires a supply of cool air to ensure that a moderate operating temperature is maintained within the device. For example, the device 218 includes a pair of fan-equipped vents 228 facing outward of the device 218 and visible from a front side 230 of the rack 202 such that the device 218 receives a supply of cool air directly from a space or corridor defined at least in part by a corresponding front side of the arrangement 200. In such circumstances, the device 218 typically further includes one or more exhaust vents (obscured) facing outward of the device 218 and visible from a rear side 232 of the rack 202 opposite the front side 230 thereof such that the device 218 vents warm exhaust air directly into a space or corridor defined at least in part by a corresponding rear side of the arrangement 200.

A prior art arrangement 300 shown in FIG. 3 includes multiple instances of a cable management rack similar to the cable management racks 100, 202, 204 of FIGS. 1 and 2, including a rack 302, a rack 304, and a rack 306, an instance of a cable management cage similar to the cage 210 of FIG. 2 (cage 308 disposed between the rack 302 and the rack 304), and an instance of a cable management cage similar to the cages 212 and 214 of FIG. 2 (cage 310 disposed between the rack 304 and the rack 306). A space or corridor 312 defined at least in part by a front side 314 of the arrangement 300 includes a supply of cool air for cooling such devices (not shown for the sake of convenience) as are mounted in the racks 302, 304, 306 of the arrangement 300. As shown by respective flows of cool air indicated at 316, 318 and 320, the cooling air enters the devices (not shown) mounted in the racks 302, 304, 306 of the arrangement 300 via the front side 314 of the arrangement 300 adjacent the corridor 312. A space or corridor 322 is defined at least in part by a rear side 324 of the arrangement 300, and as shown by respective flows of warm exhaust air indicated at 326, 328, and 330, the resulting warm exhaust air exits the devices (not shown) mounted in the racks 302, 304, 306 of the arrangement 300 via the rear side 324 of the arrangement 300 adjacent the corridor 322.

As described above, the ventilation arrangements depicted in FIGS. 2 and 3 are appropriate for purposes of cooling devices configured to receive cooling air approaching such devices from directly in front of the arrangements 200, 300 and to expel warm exhaust air by passing such warm air directly to the rear of the arrangements 200, 300. Despite efforts to date, a need remains for racks and associated ventilation arrangements and systems designed to deliver cooling air to, and to eliminate warm exhaust air from, devices mounted within such racks in a more effective and/or reliable manner. These and other needs are satisfied by the racks and associated ventilation systems disclosed herein.

SUMMARY

In accordance with embodiments of the present disclosure, cable management racks, associated ventilation systems, and related techniques are disclosed for providing sideways-directed flows of cooling air into such racks and into heat-generating devices mounted therein (or thereon), and for facilitating the passage of sideways-directed flows of exhaust air outward of such devices and out of such racks. The disclosed racks, ventilation systems, and techniques facilitate redirection of cooling flows from spaces or corridors positioned adjacent to respective front sides of such racks sideways into such racks and into (and/or alongside) such heat-generating devices, and further facilitate redirection of exhaust flows from such devices and from such racks rearward into spaces or corridors positioned adjacent to respective rear sides of such racks.

In accordance with embodiments of the present disclosure, a cable management rack is provided within or upon which a heat-generating device is mountable, and which encompasses a vertical rectangular frame open in a front and a rear of the frame. The rack further includes a first upright and a second upright attached to opposite respective lateral sides of a base and a top member. The rack still further includes respective side-facing panels. According to exemplary embodiments of the present disclosure, each of the respective side-facing panels advantageously defines a respective corresponding plurality of vent holes arranged in an array and effective to permit the rack to receive a straight lateral sideways flow of cooling air into a first side of the rack through one of the vent hole arrays for cooling a heat-generating device mounted between the side-facing panels, and to permit the rack to discharge a corresponding straight lateral sideways flow of exhaust air through the other of the vent hole arrays. With respect to each respective side-facing panel, the respective corresponding plurality of vent holes may extend across a predominant portion of a side-facing surface area of the side-facing panel, may extend across substantially an entire height of the rack, and/or may extend across substantially an entire depth of the rack. Further with respect to each respective plurality of vent holes, the array thereof may manifest a honeycomb pattern, and/or each of the vent holes thereof may manifest an hexagonal shape, and/or a punched hole perforating the respective side-facing panel.

In an alternate embodiment of the present disclosure, either or each of the respective side facing panels advantageously defines an integral baffle. If both side facing panels possess an integral baffle, they may be arranged with respective integral baffles extending from diagonally opposing uprights of the side facing panels. The integral baffles are generally angularly oriented relative to the substantially rectangular rack and are effective to permit the rack to receive a lateral sideways flow of cooling air into a first side of the rack through one of the cavities defined by a first integral baffle, and to permit the rack to discharge a corresponding (or substantially corresponding) lateral sideways flow of exhausting air through the other cavity defined by the other integral baffle.

In accordance with embodiments of the present disclosure, a cable management system is provided, the system being operable to deliver a supply of cooling air to a heat generating device mounted therewithin (and/or thereon), and including a cable management rack for accommodating a heat-generating device, the rack encompassing a vertical rectangular frame open in a front and a rear of the frame and including first and second uprights attached to opposite respective lateral sides of a base and a top member, a first baffle mounted with respect to or integrally extending from the first upright and configured and dimensioned to redirect a rearward flow of cool air from a space adjacent a front side of the rack sideways through the first upright, and a second baffle mounted with respect to or integrally extending from the second upright and configured and dimensioned to redirect a sideways flow of exhaust air from the rack and through the second upright rearward into a space adjacent a rear side of the rack. The cable management system may further include (i) a third baffle mounted with respect to or integrally extending from the first upright in vertical alignment with the first baffle and configured and dimensioned to redirect a second, separate rearward flow of cool air from the space adjacent the front side of the rack sideways through the first upright, and (iv) a fourth baffle mounted with respect to or integrally extending from the second upright in vertical alignment with the third baffle and configured and dimensioned to redirect a second, separate sideways flow of exhaust air from the rack and through the second upright rearward into a space adjacent a rear side of the rack.

Also, the cable management system may include a second cable management rack for accommodating heat-generating device(s), the second cable management rack encompassing a vertical rectangular frame open in a front and a rear of the frame and including first and second uprights attached to opposite respective lateral sides of a base and a top member, and a third cable management rack for accommodating a heat-generating device, the third cable management rack encompassing a vertical rectangular frame open in a front and a rear of the frame and including first and second uprights attached to opposite respective lateral sides of a base and a top member, wherein a first baffle is further mounted with respect to or integrally extending from the second upright of the second rack and is configured and dimensioned to redirect a second sideways flow of exhaust air from the second rack and through the second upright thereof rearward into the space adjacent the rear side of the rack, and a second baffle is mounted with respect to or integrally extending from the first upright of the third rack and is configured and dimensioned to redirect a second rearward flow of cool air from the space adjacent the front side of the rack sideways through the first upright thereof.

In accordance with embodiments of the present disclosure, a method is provided for cooling a heat-generating device mounted in (or on) a cable management rack encompassing a vertical rectangular frame open in a front and a rear of the frame and including respective first and second uprights attached to opposite respective lateral sides of a base and a top member, the method including receiving a rearward flow of cool air from a space adjacent a front side of the rack and redirecting the flow of cool air sideways through the first upright and into the heat-generating device, and redirecting a sideways flow of exhaust air passing out of the heat-generating device, and through the second upright, rearward to a space adjacent a rear side of the rack. The method may further include receiving another rearward flow of cool air from the space adjacent the front side of the rack and redirecting the another rearward flow of cool air sideways through the first upright and into a second heat-generating device mounted in the rack, and redirecting another sideways flow of exhaust air passing out of another heat-generating device, and through the second upright, rearward to the space adjacent the rear side of the rack.

Additional features, functions and benefits of the disclosed racks, ventilation systems, and associated methods and techniques will be apparent from the detailed description which follows, particularly when read in conjunction with the appended figures.

BRIEF DESCRIPTION OF FIGURES

To assist those of skill in the art in making and using the disclosed equipment mounting racks and associated ventilation systems, wherein:

FIGS. 6, 7, 8, and 9 are views of corresponding portions of respective first, second, third, and fourth variations of the arrangement of FIG. 5 illustrating different placement positions for and quantities of the baffles disposed between the ventilated uprights of respective racks;

DESCRIPTION OF EXEMPLARY EMBODIMENT(S)

Figure 1:
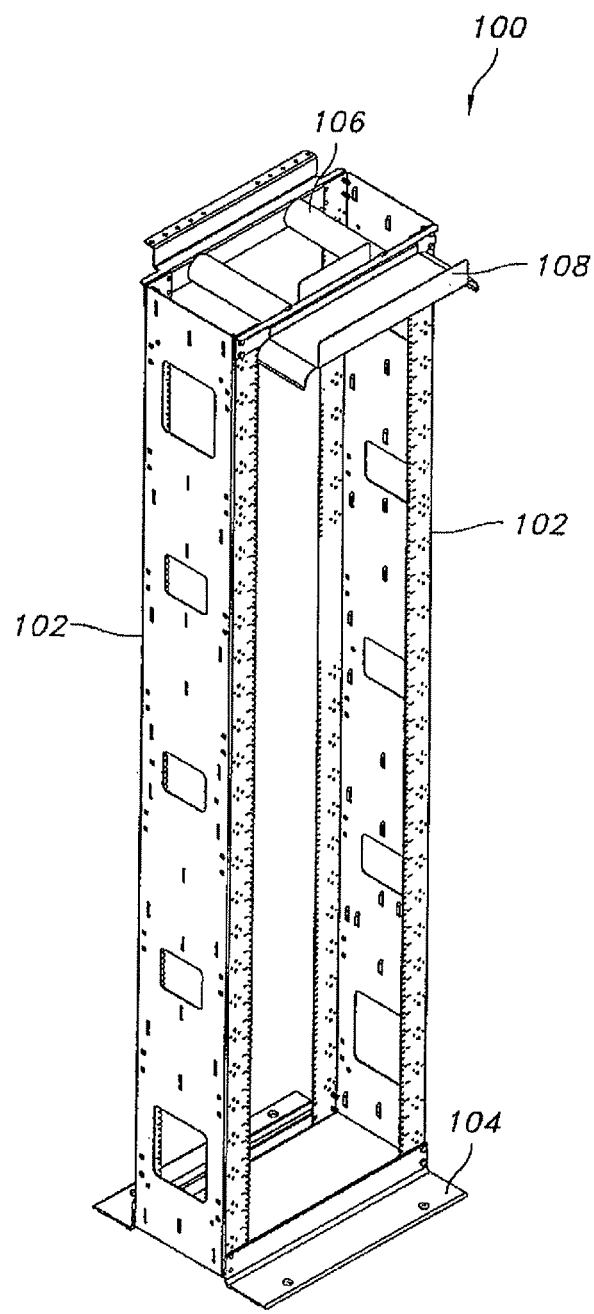
FIG. 1 is a perspective side view of a known cable management rack.
Figure 2:
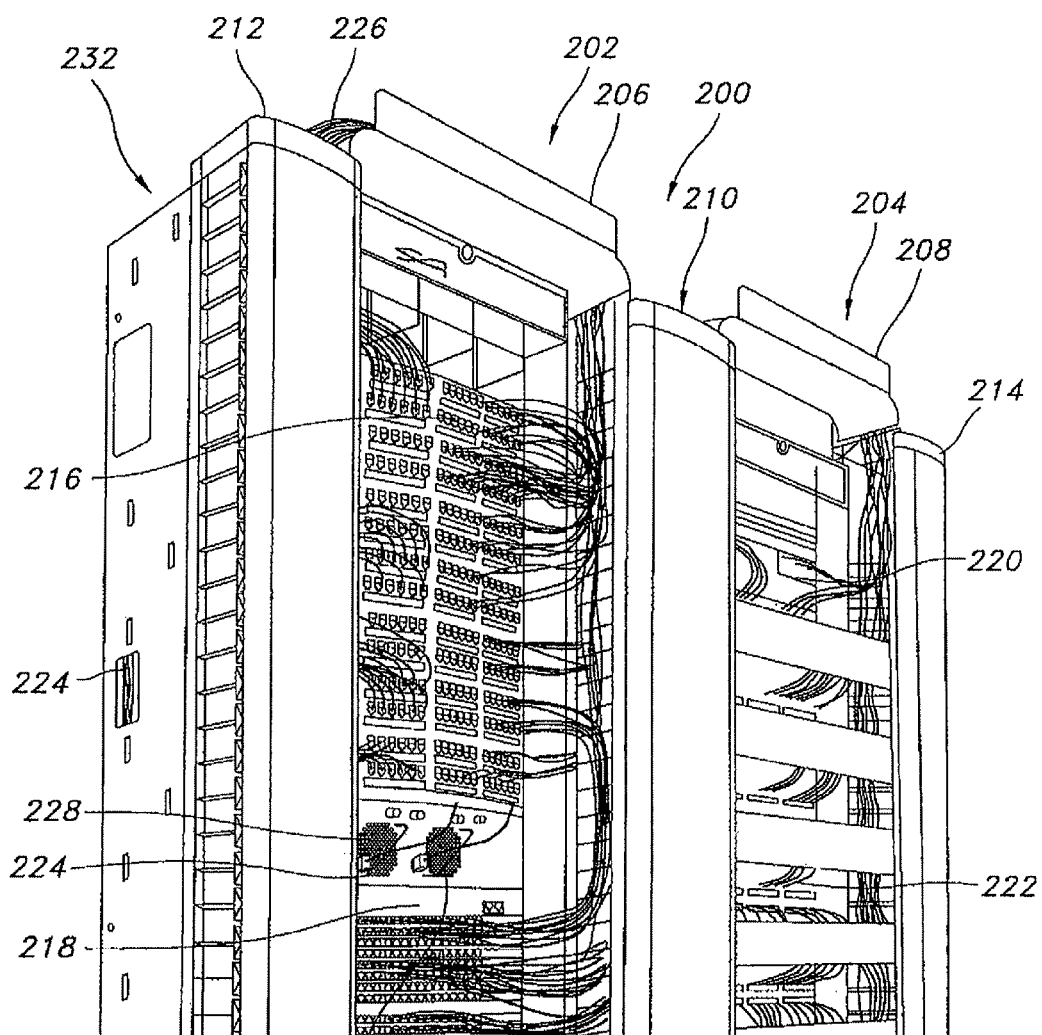
FIG. 2 is a partial perspective side view of a known arrangement of cable management racks, cable management cages, devices mounted in the racks, and cables mounted with respect to the racks and cages and interconnected with the devices.
Figure 3:
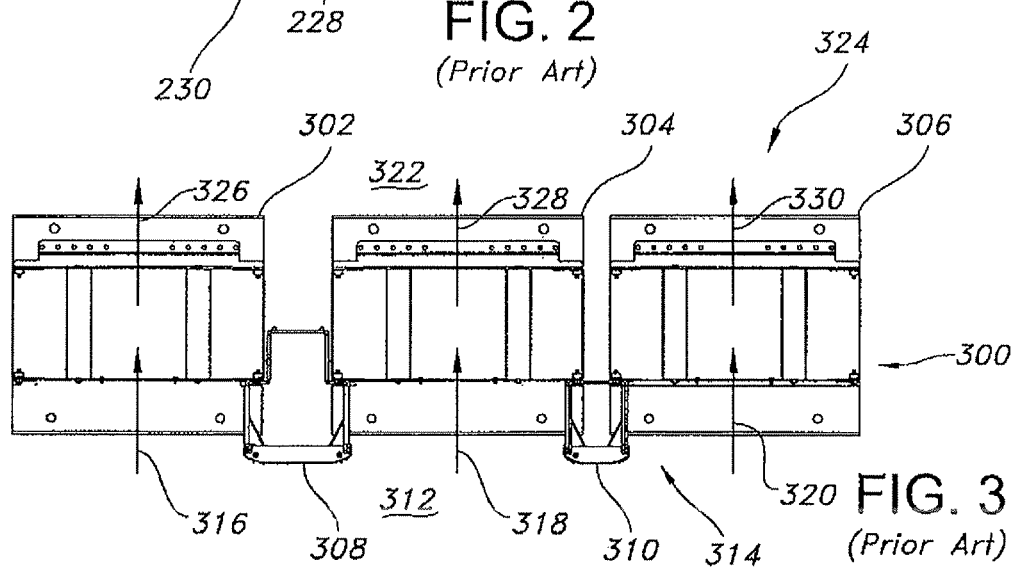
FIG. 3 is a schematic plan view of a known arrangement of cable management racks and cable management cages illustrating conventional flows for receiving cooling air from a corridor adjacent a front side of the arrangement directly into devices mounted in the racks, and for discharging warm exhaust air from the mounted devices directly into a corridor adjacent a rear side of the arrangement.
Figure 4:
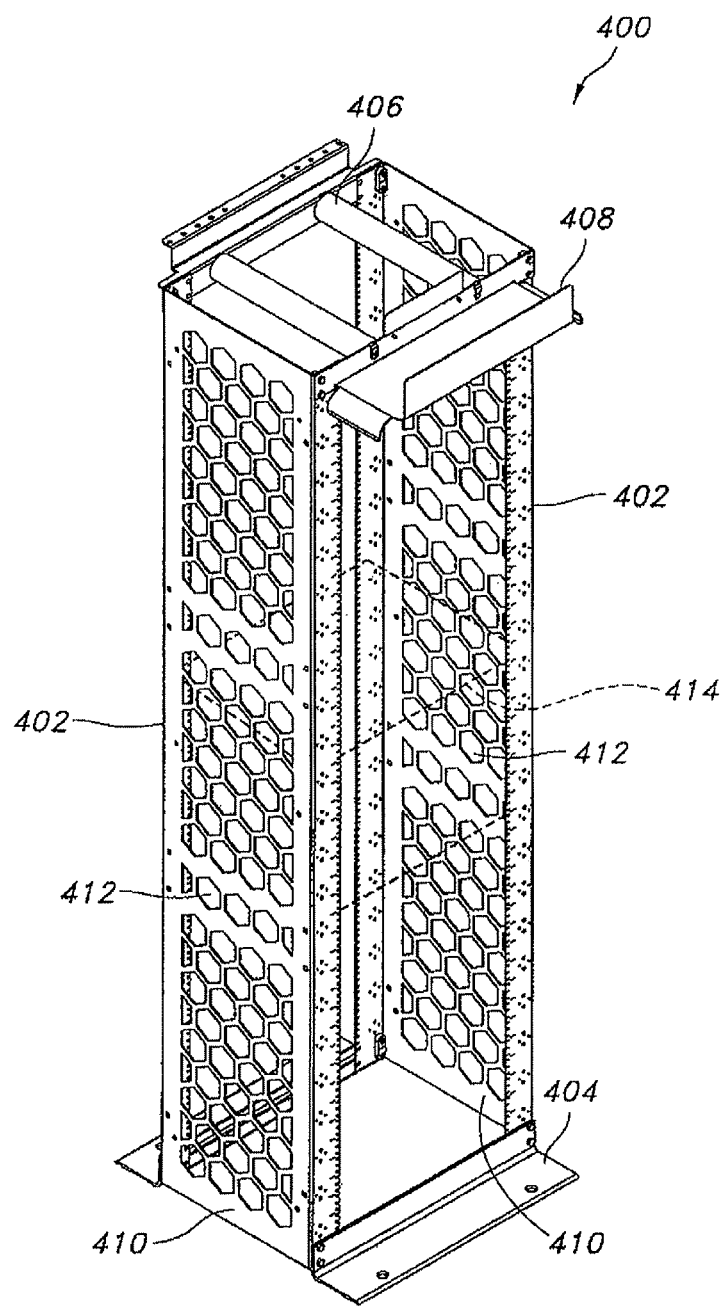
FIG. 4 is a perspective side view of a cable management rack incorporating respective uprights having ventilated side panels in accordance with embodiments of the present disclosure.
Figure 10:
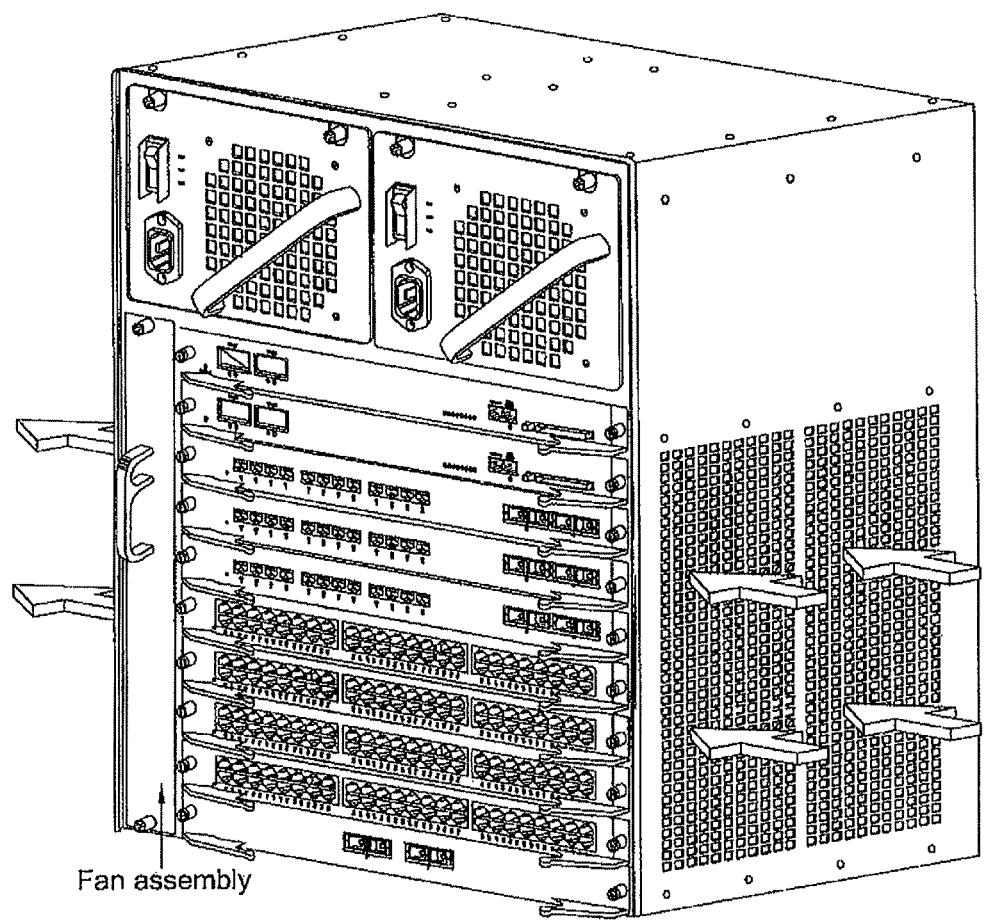
FIG. 10 is an isometric view of a switch device featuring side-to-side ventilation.

With reference to FIG. 4, an instance of a cable management rack is depicted in accordance with the present disclosure in the form of a rack 400. The rack 400 may encompass a tall, rectangular frame, and may include two uprights 402. The two uprights 402 may be attached to a base 404 at a bottom margin of the frame. The two uprights 402 may further be attached to a top member 406. The top member 406 may include a waterfall 408 for facilitating the formation of appropriately large bend radii in cables (not separately shown) mounted with respect to the rack 400. Each of the uprights 402 may include side panel 410. Each side panel 410 may include a plurality of vent holes 412 for facilitating the passage of air through the side panel 410, such that the rack 400 is operable as a component of a ventilation system for delivering an effective flow of cooling air to one or more heat generating devices (one of which is shown schematically in FIG. 4 at reference numeral 414) mounted in the rack 400 through the vent holes 412 of a side panel 410, and/or to promote an effective flow of warm exhaust air therefrom through the vent holes 412 of a side panel 410. In such circumstances, the rack 400 is a suitable rack for receiving heat-generating devices (e.g., such as the Catalyst WS-C4510R switch marketed by Cisco Systems, Inc., an illustration of which is provided in FIG. 10, and/or other switches marketed by Cisco Systems, such as the Catalyst WS-C6513, and/or switches marketed by other companies than Cisco, and/or one or more non-switch devices with side-to-side ventilation) configured to draw cooling air through a lateral side of the device 414 (e.g., as opposed to through a front panel of the device 414) adjacent one of the side panels 410, and to expel warm exhaust air through an opposite lateral side of the device 414 (e.g., as opposed to through a rear panel of the device) adjacent the other of the side panels 410. It is noted that while such a side-cooled and side-exhausted device 414 is entirely compatible with the rack 400, the same may not necessarily be as compatible with conventional cable management racks, predominant portions of the respective areas (i.e., height and breadth) of the side panels of the uprights of which tend to be intact and substantially unperforated, and may therefore be substantially impervious to the passage of cooling and/or exhaust air flows therethrough.

Specifically with respect to the embodiment shown in FIG. 4, the plurality of vent holes 412 may advantageously collectively extend across a predominant portion of the surface area (e.g., the height and breadth) of the side panel 410, and/or each of the vent holes may advantageously be of sufficiently large size relative to a thickness of the side panel 410, to allow the side panel 410 to offer a relatively low level of resistance to the passage of air through the side panel 410 consistent with the rack 400 being operable to deliver an effective flow of cooling air to the device 414 through the vent holes 412 of a side panel 410, and/or to eliminate an effective flow of exhaust air from the device 414 through the vent holes 412 of a side panel. As shown in FIG. 4, in accordance with embodiments of the present disclosure, the vent holes 412 may take the form of one or more regular or irregular arrays (e.g., one or more similarly configured regular or irregular arrays) comprising a plurality of such vent holes 412 and collectively representing a predominant portion (e.g., between about 50% to about 55%, between about 55% to about 60%, between about 60% to about 65%, between about 65% to about 70%, between about 70% to about 75%, between about 75% to about 80%, between about 80% to about 85%, and/or greater than about 85%) of the total area (e.g., the entire height and breadth/depth) of the side panel 410 of the respective upright 402. Other arrangements are possible, including embodiments wherein the vent holes 412 take the form of a regular array comprising a plurality of such vent holes 412 representing a predominant portion (e.g., between about 50% to about 55%, between about 55% to about 60%, between about 60% to about 65%, between about 65% to about 70%, between about 70% to about 75%, between about 75% to about 80%, between about 80% to about 85%, and/or greater than about 85%) of the total area (e.g., the entire height and breadth/depth) of a portion of the side panel 410 of the respective upright 402 (e.g., wherein the a portion in question of the side panel 410 represents between about 10% to about 15%, between about 15% to about 20%, between about 20% to about 25%, between about 25% to about 30%, between about 30% to about 35%, between about 35% to about 40%, between about 40% to about 45%, between about 45% to about 50%, between about 50% to about 55%, between about 55% to about 60%, between about 60% to about 65%, between about 65% to about 70%, between about 70% to about 75%, and/or between about 75% to about 80%, of the total area (e.g., the entire height and breadth/depth) of the side panel 410 of the respective upright 402).

As shown in FIG. 4, in accordance with embodiments of the present disclosure, the vent holes 412 may advantageously form one or more honeycomb-type arrays of hexagonal perforations through the side panel 410 as shown in FIG. 4, wherein the respective shapes of the array and the individual perforations may be beneficial for purposes of achieving relatively high structural rigidity while simultaneously permitting a relatively high proportion of the area (e.g., height and breadth/depth) covered by the respective arrays to be open and amenable to the unhindered passage through the upright 402 of respective flows of cooling and/or warm exhaust air with respect to the device 414 mounted therein. In accordance with other embodiments of the present disclosure, other shapes than a honeycomb shape may be provided for the array of vent holes 412, and/or other shapes than a hexagonal shape may be provided for the vent holes 412 themselves. For example, the vent holes 412 may be arranged in an regular array of columns and rows (e.g., vertical columns and horizontal rows), and/or the vent holes themselves may manifest other shapes (e.g., regular or irregular shapes, circles, rhombi, squares, rectangles, etc., or a combination thereof). Further, the vent holes 412 need not necessarily be punched holes, but may be formed using any number of conventional manufacturing techniques (e.g., via molding, machining, drilling, etc.), and need not necessarily provide a perpendicular and/or a straight path for air to pass through the upright 402 (e.g., may be oriented at an angle to the normal, and/or may be provided with one or more slanted and/or fixed and/or movable fins or vanes or louvers to influence the flow of air through the upright).

Figure 5:
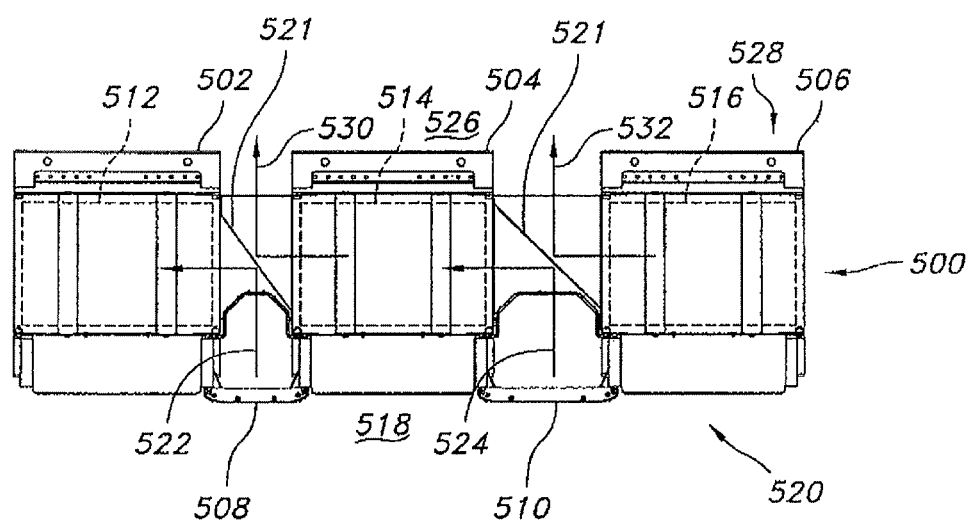
FIG. 5 is a schematic plan view of an arrangement in accordance with the present disclosure of cable management racks similar to the rack illustrated in FIG. 4, cable management cages mounted between and beside the racks, devices mounted with respect to the racks, and flow redirection baffles disposed in spaces between the racks, wherein the arrangement illustrates inventive flows for receiving cooling air from a corridor adjacent a front side of the arrangement and for discharging warm exhaust air from the mounted devices indirectly into a corridor adjacent a rear side of the arrangement.

Turning now to FIG. 5, an arrangement 500 in accordance with embodiments of the present disclosure includes multiple instances of a cable management rack similar to the rack 400 of FIG. 4, including a rack 502, a rack 504, and a rack 506, a cable management cage 508 disposed between the rack 502 and the rack 504, a cable management cage 510 disposed between the rack 504 and the rack 506, a side-cooled device 512 mounted in the rack 502, a side-cooled and side-exhausted device 514 mounted in the rack 504, and a side-exhausted device 516 mounted in the rack 506. A space or corridor 518 defined at least in part by a front side 520 of the arrangement 500 includes a supply of cool air for cooling at least the device 512 mounted in the rack 502, and the device 514 mounted in the rack 504. The arrangement 500 further includes multiple instances of a baffle 521 for redirecting respective flows of cooling and/or warm exhaust air flows. As shown by respective flows of cool air indicated at 522 and 524, the cooling air enters the devices 512, 514 via respective lateral sides of each such device 512, 514 after having been received from the front side 520 of the arrangement 500 adjacent the corridor 518 and redirected (e.g., redirected 90 degrees) by a respective instance of a baffle 521, such that the devices 512, 514 receive the flows 522, 524 only indirectly, rather than directly, through the front side 520 of the arrangement 500 adjacent the corridor 518. A space or corridor 526 is defined at least in part by a rear side 528 of the arrangement 500, and as shown by respective flows of warm exhaust air indicated at 530 and 532, respective flows of warm exhaust air exit the devices 514, 516 via respective lateral sides of each such device 514, 516, and are redirected (e.g., redirected 90 degrees) by respective instances of a baffle 521, such that the devices 514, 516 discharge the flows 530, 532 only indirectly, rather than directly, through the rear side 528 of the arrangement adjacent the corridor 526.

As those of ordinary skill will readily recognize, the present disclosure, and more particularly, the arrangement 500, is not necessarily limited to embodiments including cable management cages (e.g., such as the cable management cage 508 or the cable management cage 510). For example, in accordance with embodiments of the present disclosure, either or both of the cable management cage 508 and the cable management cage 510 may be removed, and/or substituted for by the use of any other suitable system or component capable of performing the function of vertical style wire management.

As shown in FIGS. 6, 7, 8, and 9, each of which illustrates a portion of a respective variation of the arrangement 500 of FIG. 5, each of the racks 502, 504, and 506 may include an upright 600 similar to the uprights 402 of FIG. 4, and may further include a perforated side panel 602. Each instance of a baffle 521 may be mounted against a side panel 602 with respective first and second mounting flanges 605, 606. One or more (or all) of the baffles 521 may include a cover 604 for preventing at least one of a flow of cooling air flow or a flow of warm exhaust air from extending beyond a certain distance vertically in the regions of the baffles 521 between the racks 502, 504, and 506 (e.g., to reduce and/or eliminate the intermingling of exhaust flows associated with respective side-cooled and/or side-exhausted devices resident in the same rack, and/or to reduce and/or eliminate the possibility that an exhaust flow from one side-cooled and/or side-exhausted device will back up into another such device resident in the same rack).

Figure 11:
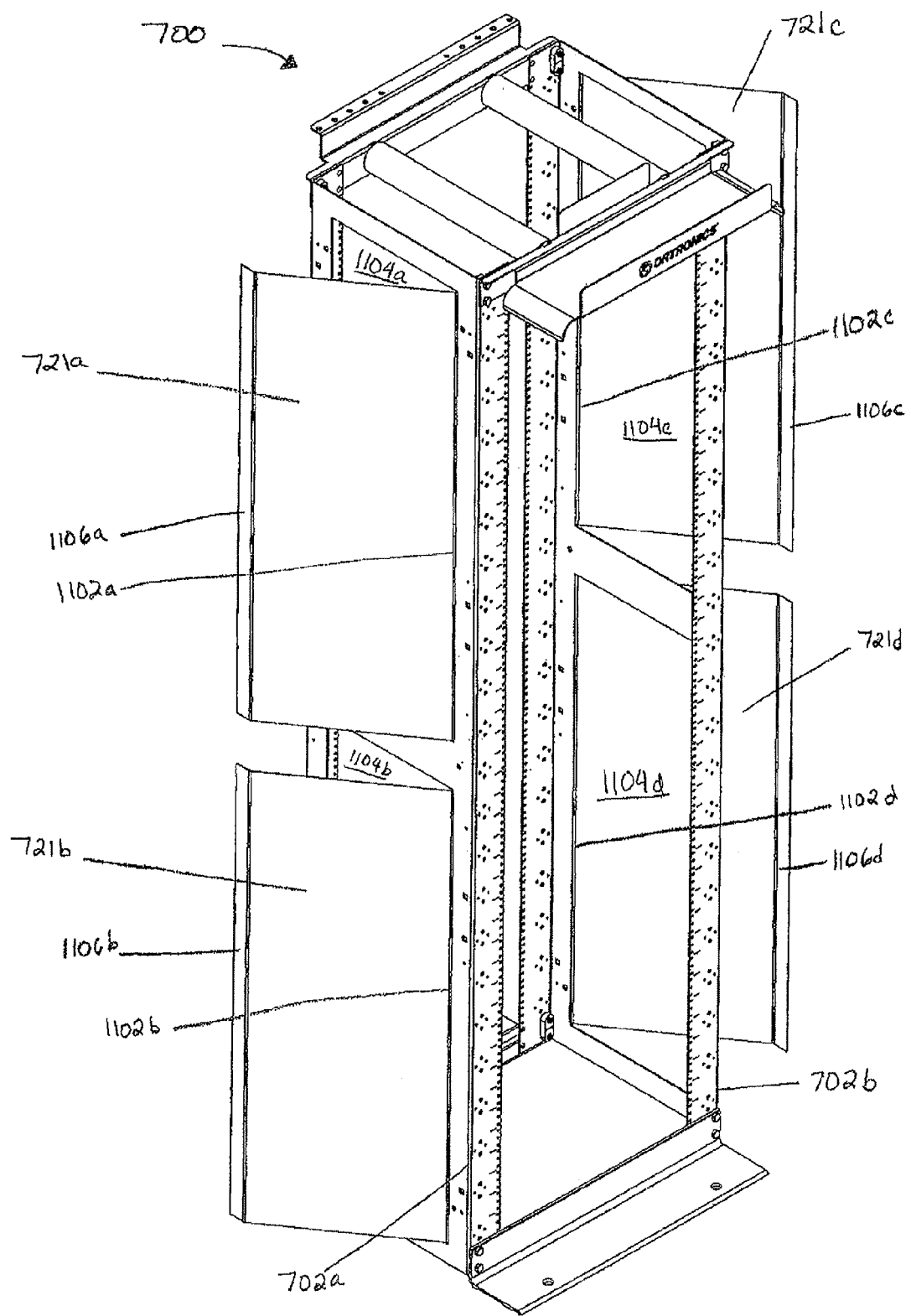
FIG. 11 is a perspective side view of a cable management rack incorporating respective uprights having integral baffles extending therefrom in accordance with an alternate embodiment of the present disclosure.

With reference to FIG. 11, an alternate rack embodiment is depicted in accordance with the present disclosure. In the exemplary embodiment of FIG. 11, rack 700 includes first and second uprights 702a, 702b. With initial reference to upright 702a, first and second vertically-spaced integral baffles 721a, 721b extend therefrom. Integral baffles 721a, 721b extend from upright 702a along vertically-oriented bend regions 1102a, 1102b, respectively. Of note, a substantially rectangular openings 1104a, 1104b are defined in the side face of rack 700 that substantially correspond in size to the total area of integral baffles 721a, 721b. This correspondence between rectangular openings 1104a, 1104b and integral baffles 721a, 721b arises because the integral baffles are generally formed through metal working of material initially filling the space of rectangular openings 1104a, 1104b. Integral baffles 721c, 721d extend from upright 702b relative to vertically-oriented bend regions 1102c, 1102d and generally correspond in area to the corresponding rectangular opening 1104c, 1104d defined in the side face of upright 702b.

Each of the integral baffles 721a-721d may advantageously define a vertically-oriented flange or lip 1106a-1106d along an exposed edge thereof. The flange/lip facilitates positioning of rack 700 relative to adjacent structures, e.g., adjacent racks, and is generally oriented substantially parallel to the side face of the corresponding upright. The disclosed flange(s)/lip(s) may include a plurality of apertures/slots (not pictured) that facilitate attachment to adjacent structures, e.g., adjacent racks. Of note, the angular orientations of integral baffles 721a-721d relative to the corresponding upright—which are defined by the angles formed in bend regions 1102a-1102d—may vary from implementation-to-implementation, but such angle typically ranges from about 30° to about 60°. The angular orientation of integral baffles 721a-721d advantageously facilitates sideways air flow into and out of rack 700. In the exemplary embodiment of FIG. 11, opposed integral baffles 721a, 721b and 721c, 721d extend from diagonally opposing regions of uprights 702a, 702b. In this way, entering air flow may be derived from a region in front of rack 700 and exiting air flow—which is heated—may be directed toward the rear of rack 700. However, it is also contemplated according to the present disclosure that opposed integral baffles may open in the same direction, e.g., toward the front or toward the rear, or that spaced In an alternate embodiment, not depicted, integral baffles of the type disclosed with reference to FIG. 11 may be associated with one upright of a rack, whereas non-integral baffle structures of the type disclosed with reference to FIGS. 5-9 may be associated with a second upright of a rack. Similarly, vented/apertured structures of the type disclosed with reference to FIGS. 4, 6, 7 and 9 may be associated with uprights that include either integral or non-integral baffles, as disclosed herein. Thus, as those of ordinary skill will readily recognize, the integral and non-integral baffles disclosed herein can be used with various rack designs.

Although the present disclosure has been described with reference to exemplary embodiments and implementations, it is to be understood that the present disclosure is neither limited by nor restricted to such exemplary embodiments and/or implementations. Rather, the present disclosure is susceptible to various modifications, enhancements and variations without departing from the spirit or scope of the present disclosure. Indeed, the present disclosure expressly encompasses such modifications, enhancements and variations as will be readily apparent to persons skilled in the art from the disclosure herein contained.

The invention claimed is:

1. A system, comprising:
   a. a first assembly that includes a frame defining a front, a rear, a first lateral side and a second lateral side, wherein the front and the first side intersect along a vertical axis;
   b. a second assembly that includes a frame defining a front, a rear, a first lateral side and a second lateral side; and
   c. a first baffle that includes a first mounting flange and a second mounting flange, the first mounting flange is mounted to the first lateral side of the first assembly adjacent to the front of the first assembly and the second mounting flange is mounted to the second lateral side of the second assembly adjacent to the rear of the second assembly, wherein the first baffle is positioned between the first assembly and the second assembly so as to be external to the frame of the first assembly and external to the frame of the second assembly, wherein the first baffle is mounted along said vertical axis, and wherein the first baffle is angularly oriented with respect to the first lateral side of the first assembly and with respect to the second lateral side of the second assembly.

2. The system according to claim 1, wherein the first lateral side of the first assembly and the second lateral side of the second assembly define a height and wherein the first baffle extends the entire height of the first lateral side of the first assembly and the second lateral side of the second assembly.

3. The system according to claim 1, wherein the first lateral side of the first assembly and the second lateral side of the second assembly define a height and wherein the first baffle extends a portion of the height of the first lateral side of the first assembly and the second lateral side of the second assembly.

4. The system according to claim 1, wherein the first baffle defines a bottom and wherein the bottom of the first baffle is vertically aligned with a bottom of the first assembly and the second assembly.

5. The system according to claim 1, wherein the first baffle defines a top and wherein the top of the first baffle is vertically aligned with a top of the first assembly and the second assembly.

6. The system according to claim 1, wherein the first baffle defines a bottom and a top, wherein the bottom of the first baffle is not vertically aligned with a bottom of the first assembly and the second assembly, and wherein the top of the first baffle is not vertically aligned with a top of the first assembly and the second assembly.

7. The system according to claim 1, wherein the first baffle defines a first mounting flange along a first edge thereof.

8. The system according to claim 7, wherein the first baffle further defines a second mounting flange along a second edge thereof.

9. The system according to claim 1, wherein the first baffle defines an upper end that is structurally bounded so as to prevent flow of air redirected by the first baffle from extending beyond the upper end of the first baffle.

10. The system according to claim 9, further comprising a cover that structurally bounds the first baffle at the upper end.

11. The system according to claim 1, wherein the first baffle is configured and dimensioned to redirect a rearward flow of cool air that passes from a front space adjacent to the front of the second assembly sideways through the second lateral side of the second assembly and into an interior region of the second assembly.

12. The system according to claim 11, wherein the cool air enters the interior region by passing from the front space adjacent to the front of the second assembly sideways through the second lateral side of the second assembly based on redirection by the first baffle.

13. The system according to claim 1, wherein the first baffle is configured and dimensioned to redirect a sideways flow of exhaust air from an interior region of the first assembly through the first lateral side of the first assembly rearward into a rear space adjacent to the rear of the first assembly.

14. The system according to claim 13, wherein exhaust air exits from the interior region of the first assembly through the first lateral side of the first assembly rearward into the rear space adjacent to the rear of the first assembly based on redirection by the first baffle.

15. The system according to claim 1, further comprising a second baffle fixedly mounted to the first lateral side of the first assembly above the first baffle.

16. The system according to claim 15, wherein the second baffle defines an upper end that is structurally bounded so as to prevent flow of air redirected by the second baffle from extending beyond the upper end of the second baffle.

17. The system according to claim 16, wherein the first baffle and the second baffle extending laterally from the first lateral side at a same angle relative to the first lateral side.

18. The system according to claim 1, wherein the first baffle extends laterally from the first lateral side at an angle that ranges from about 30 degrees to about 60 degrees relative to the first lateral side.

19. The system according to claim 1, wherein the first baffle includes a first mounting flange on a first end thereof.

20. The system according to claim 19, wherein the first mounting flange is vertically oriented when the first baffle is mounted with respect to the first assembly.

21. The system according to claim 19, wherein the first baffle includes a second mounting flange on a second end thereof.

22. The system according to claim 21, wherein the first mounting flange and the second mounting flange are parallel to each other.

23. The system according to claim 1, wherein the first mounting flange and the second mounting flange are parallel to each other.

24. A rack system, comprising:
   a. a vertical rectangular frame for accommodating at least one heat-generating device in a horizontal orientation, the vertical rectangular frame including a front, a rear opposing the front, a first side, a second side opposing the first side, and an interior region defined by the front, the rear, the first side and the second side of the vertical rectangular frame, wherein the front and the first side intersect along a vertical axis; and b. a vertically oriented first baffle that includes a mounting flange, the mounting flange fixedly mounted to the first side of the vertical rectangular frame along said vertical axis adjacent to the front of the vertical rectangular frame;

wherein said first baffle extends laterally from the first side so as to be positioned outside of the interior region at an angle that is between 0 degrees and 90 degrees relative to the first side, and wherein the first baffle extends laterally from a position adjacent to the front of the vertical rectangular frame a full length of the first side to a position aligned with and laterally spaced from the rear of the vertical rectangular frame.

25. A system, comprising:

a. a first assembly that includes a frame defining a front, a rear, a first lateral side and a second lateral side;

b. a second assembly that includes a frame defining a front, a rear, a first lateral side and a second lateral side;

c. a first baffle mounted with respect to the first lateral side of the first assembly adjacent to the front of the first assembly and mounted with respect to the second lateral side of the second assembly adjacent to the rear of the second assembly; and d. a cable management cage mounted with respect to at least one of the first assembly and the second assembly, wherein the cable management cage is positioned between the first assembly and the second assembly in front of the first baffle, wherein the first baffle is positioned between the first assembly and the second assembly, and is angularly oriented with respect to the first lateral side of the first assembly and with respect to the second lateral side of the second assembly.

* * * * *